United States Patent [19]

Campbell

[11] Patent Number: 4,565,976
[45] Date of Patent: Jan. 21, 1986

[54] INTERRUPTABLE VOLTAGE-CONTROLLED OSCILLATOR AND PHASE-LOCKED LOOP USING SAME

[75] Inventor: David L. Campbell, Sunnyvale, Calif.

[73] Assignee: Advanced Micro Devices, Inc., Sunnyvale, Calif.

[21] Appl. No.: 520,876

[22] Filed: Aug. 5, 1983

[51] Int. Cl.[4] .............................................. H03B 1/00
[52] U.S. Cl. ........................................ 331/57; 331/34; 331/108 B; 331/143; 307/455
[58] Field of Search ............... 307/455, 228, 234, 263; 328/112, 185; 331/2, 48, 34, 57, 104, 108 B, 111, 143, 177 R, DIG. 3; 375/87, 120

[56] References Cited

U.S. PATENT DOCUMENTS

| | | | |
|---|---|---|---|
| 3,396,282 | 8/1968 | Sheng et al. | 307/263 X |
| 3,522,447 | 8/1970 | Borenstein | 307/228 |
| 3,831,112 | 8/1974 | Walton | 331/108 B |
| 4,015,216 | 3/1977 | Masuda | 331/8 |
| 4,030,010 | 6/1977 | Schwartz | 328/112 X |
| 4,052,673 | 10/1977 | Herzog | 331/108 B X |
| 4,131,861 | 12/1978 | Malaviya | 331/2 |
| 4,191,932 | 3/1980 | Nagahama | 331/111 |
| 4,233,525 | 11/1980 | Takahashi et al. | 328/112 X |
| 4,319,200 | 3/1982 | Terwilliger | 331/34 X |

OTHER PUBLICATIONS

Wise, C. D. et al., "Building an Oscillator Using a Single I.C.", Electronic Design 20, (Sep. 26, 1968), p. 71.
Abdel-Aal, R. E. S., "Pulse Width Detector", Wireless World, v. 85, n. 1526, (Oct. 1979), p. 86.
Hickman, I., "Voltage Controlled Oscillator Using Spare Gates", New Electronics, v. 12, n. 14, (Jul. 10, 1979), p. 40.

Primary Examiner—Eugene R. LaRoche
Assistant Examiner—Robert J. Pascal
Attorney, Agent, or Firm—Patrick T. King; J. Vincent Tortolano; Mark A. Haynes

[57] ABSTRACT

The fall-time of an ECL gate is precisely controlled using a fixed capacitor, which is connected between the positive supply voltage and the ECL gate output terminal, and a variable current source connected between ground and the ECL gate output terminal. A time-delay circuit is obtained by controlling the variable current source with an error voltage of a phase-locked loop such that the time-delay precisely tracks the frequency of the reference signal for the phase-locked loop. A signal detector circuit is obtained by combining time-delay circuits. A voltage-controlled oscillator is assembled by connecting 3 ECL gates with controlled fall-times in a ring oscillator configuration. Addition of a non-inverting input to one ECL gate makes the voltage-controlled oscillator interruptible. Combining a voltage-controlled oscillator of the type described with a phase detector fed by a reference signal provides a phase-locked loop with the control voltage thereof providing a frequency-to-voltage conversion function. A system for providing a receiver clock reference signal from a received signal is provided by phase-locking the output signal of a first phase-locked loop to a system reference signal to generate a first-loop control voltage. A second phase-locked loop is phase-locked to the received signal with a second-loop control voltage. In addition, the second phase-locked loop is also frequency-locked to the system reference signal by the first-loop control voltage. This system is particularly useful for recovering a receiver clock reference from a Manchester-encoded signal.

22 Claims, 13 Drawing Figures

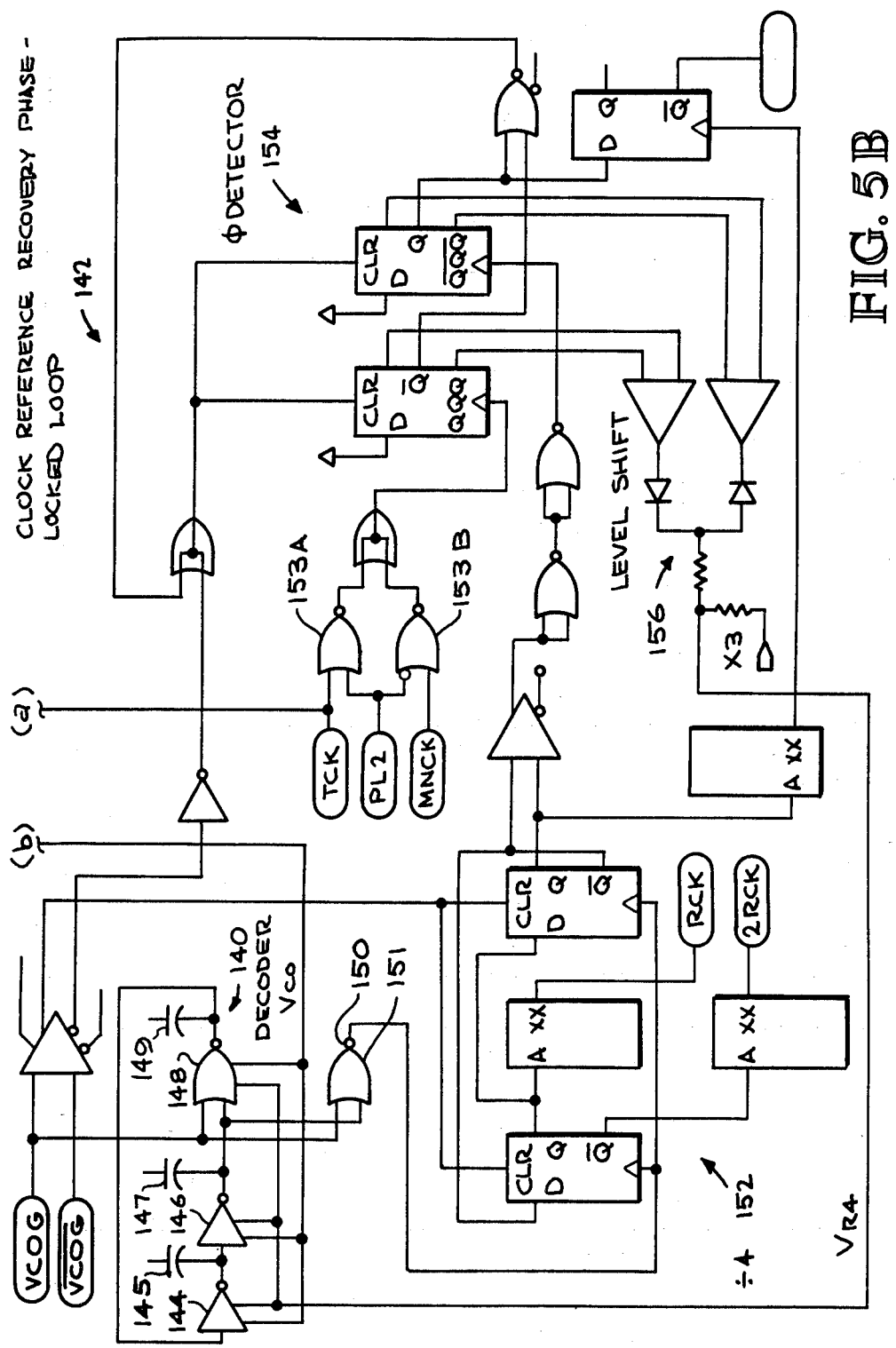

LOGIC SYMBOL

INTERRUPTABLE VOLTAGE-CONTROLLED OSCILLATOR AND PHASE-LOCKED LOOP USING SAME

BACKGROUND OF THE INVENTION

1. Field of the Invention

This invention relates to voltage-controlled oscillators and to phase-locked loops using such oscillators.

2. Background of the Invention

In conventional phase-locked receivers, such as used in data communication systems using Manchester-encoded data signals, the acquisition time for such a receiver to acquire and to lock into a received signal is a predictable function of the receiver's phase-locked loop time constants. These phase-locked loops are usually of the analog type, that is, they use a continuously variable voltage signal for controlling the frequency of the voltage-control oscillator. One particular problem associated with analog phase-locked loop receivers is that phase-lock cannot be obtained if the input signal is precisely out of phase with the receiver local oscillator signal. In applications of phase-locked loops to communication systems, wide loop bandwidths are desirable for acquisition, while much narrower bandwidths are required for tracking. Previously used techniques, such as switching various capacitors into the circuit, to obtain desired bandwidths are not suitable and are often impractical to implement in high-speed data communication systems.

Manchester-encoded communication systems are used to communicate digital information because they permit a received signal to be quickly acquired and tracked. Signals encoded in conformity with a Manchester-encoding scheme are self-clocking, that is, every bit cell of encoded information has a logic-level transition occurring at its midpoint so that a Manchester-encoded signal contains a significant clock frequency component which is separable from the data information. Manchester systems often transmit a preamble prior to actual data information being transmitted so that a receiver can acquire and lock on the input signal and establish a clock reference signal. A system for deriving a clock signal must effectively operate in the presence of noise and jitter.

Many Manchester-encoded data communication systems, such as the Ethernet Local-Area-Network system, are operated intermittently, that is, in stop-and-start applications. Packets of encoded information occur at random intervals, so that there are many time intervals when a signal line is inactive and has only random or impulse noise signals present. A conventional analog phase-locked loop receiver operating under such conditions has difficulty operating because fast acquisition requires wide loop bandwidths while operation with noisy signals requires narrow loop bandwidths, which require a compromise bandwith to be used.

For integrated circuits, accurate time-delays for pulses, that is, delays controllable to a predetermined time, plus or minus a few percent, are not easily obtained. For fixed delays, discrete delay lines have been used.

When relatively long or when variable delays are desired, discrete delay lines have become quite large and difficult to vary. In many digital systems which operate over a range of frequencies, it would be very convenient to have pulse delays which would automatically track with the pulse frequency.

It is an object of the invention to provide an ECL gate stage having a controlled fall time.

It is another object of the invention to provide a circuit which provides a precise time-delay proportional to the frequency of a reference signal.

It is another object of the invention to provide an interruptible voltage-controlled oscillator.

It is another object of the invention to provide a frequency-to-voltage converter utilizing a phase-locked loop.

It is an object of the invention to provide a voltage controlled oscillator which has its frequency separately controlled from its phase.

It is another object of the invention to provide a clock recovery system useful with intermittently sent data packets.

It is another object of the invention to provide a frequency reference signal having its frequency accurately controlled by one voltage-controlled oscillator circuit while its phase is controlled by a second voltage-controlled oscillator.

It is another object of the invention to provide a voltage-controlled oscillator having a wide frequency-tracking-bandwidth but yet a narrow locking-bandwidth.

It is another object of the invention to provide a circuit which provides a decoding clock from a Manchester-encoded data signal.

It is another object of the invention to provide a circuit for discriminating between noise and a desired signal.

It is another object of the invention to provide a circuit for detecting the presence of Manchester-encoded data signal on a signal line.

In accordance with these and other objects of the invention, an ECL gate stage having a controlled fall time is provided which is especially useful in voltage-controlled oscillators and phase-locked loop circuits. A timing capacitor and a current source are coupled to the output of the ECL gate stage. The current source controls the amount of current charging the timing capacitor to thereby control the fall time of the output signal at the gate output terminal. Both inverting and non-inverting transistors are provided for the ECL gate and the non-inverting input transistor is used to disable the ECL gate.

A voltage-controlled oscillator is provided according to the invention which utilizes a number of the ECL gate stages, timing capacitors, and current sources described above arranged in a ring oscillator configuration. A non-inverting input transistor for one of the gates is used to provide interrupted operation of the voltage-controlled oscillator, a feature particularly useful with intermittently operated systems. A voltage-controlled oscillator assembled in accordance with the invention is combined with a phase-detector in a phase-locked loop configuration. The phase-detector compares the voltage-controlled oscillator signal to a reference signal and provides an output voltage proportional to the frequency of the input signal.

A time-delay proportional to a reference frequency is provided for a pulse signal by an ECL gate stage, a timing capacitor, and a current source controlled by a reference voltage from a phase-locked loop, locked to the reference frequency. A time-delay circuit is also useful as part of a pulse-discriminator circuit. A first time-delay circuit receives an inverted input pulse and a second time-delay circuit receives the input pulse. The inverted, time-delayed signal is fed to the clear input of an edge-triggered flip-flop while the other time-delay signal is fed to the clock input of the edge-triggered flip-flop. A Manchester-encoded data signal can be detected when the delays are appropriately set.

A system is also provided for producing a receiver clock reference signal from a received signal. Two phase-locked loops are used. Each has a voltage-controlled oscillator with its output coupled to one input of a respective phase-detector. The first phase-locked loop phase-detector locks to the frequency of the system reference signal. The phase-detector output is utilized as a control voltage for the first phase-locked loop. This control voltage is also used as an additional control voltage in the second phase-locked loop. The second phase-locked loop has its own voltage-controlled oscillator and phase-detector, which receives a noisy or jittery received signal. The output of the second phase-detector is a control voltage for the phase of the second voltage-controlled oscillator. As mentioned above, the second voltage-controlled oscillator also receives another voltage control signal from the first phase-locked loop. Thus, the second voltage-controlled oscillator receives two control signals, one constraining its frequency to be near that of the system reference signal and the second being used to control the phase of the second phase-locked loop to be that of the received signal. The second phase-locked oscillator is interruptible and this two-oscillator system is particularly useful for providing a receiver clock reference signal for a Manchester-encoded data signal.

Additional objects, advantages and novel features of the invention will be set forth in part in the description which follows, and in part will become apparent to those skilled in the art upon examination of the following or maybe learned by practice of the invention. The objects and advantages of the invention will be realized and obtained by means of the instrumentalities and combinations particularly pointed out in the appended claims.

BRIEF DESCRIPTION OF THE DRAWINGS

The accompanying drawings which are incorporated in the formal part of the specification, illustrate the invention and, together with a description, serve to explain the principles of the invention. In the drawings:

FIG. 5B is a block diagram of a second interruptible phase-locked loop which provides as an output a system-reference clock locked in frequency to the system reference signal and in phase to a received signal.

DETAILED DESCRIPTION OF THE PREFERRED EMBODIMENTS

Reference is now made in detail to the present preferred embodiments of the invention which illustrate the best mode presently contemplated by the inventor for practicing the invention, the preferred embodiments of which are illustrated in the accompanying drawings.

The inventions described herein are part of a single integrated circuit device identified as the Advanced Micro Devices, Inc., AM7991 Serial Interface Adaptor designed for use in a ten megabit-per-second packet-switched local area network system. This device detects the presence of received data on a transceiver cable and transforms a received Manchester-encoded data signal into a data output signal and a clock output signal. Precision pulse delays, which are locked to the frequency of a reference signal are utilized within this integrated circuit device.

GATED RING OSCILLATOR

Figure 1:
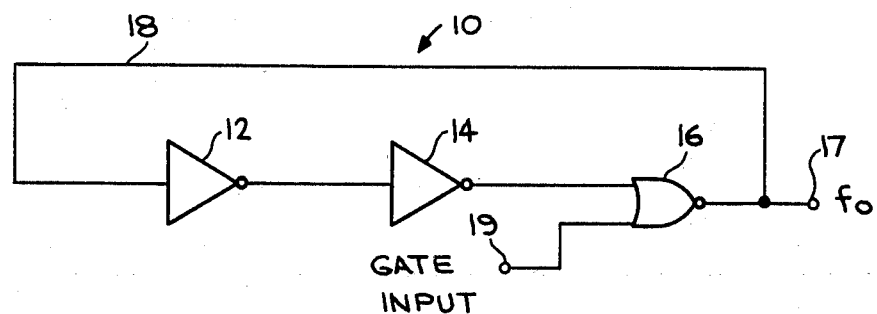
FIG. 1 is a block diagram showing a gated ring oscillator using two inverter stages and a gated NOR inverter stage.

FIG. 1 shows a gated ring oscillator circuit comprised of three inverter stages. A first inverter stage 12 and a second inverter stage 14 are cascaded to feed one input terminal of a NOR gate 16 which has its output terminal connected through a signal line 18 to the input of the inverter 12. The other input terminal 19 of the NOR gate 16 is used to gate the ring oscillator circuit on and off. Generally, gated ring oscillators of this type use n inverter stages where n is an odd integer. When the gate input at terminal 19 is low, the oscillator 10 runs with a period of $$t_p = t_{pLHA} + t_{pHLB} + t_{pLHC} + t_{pHLA} + t_{pLHB} + t_{pHLC}.$$

where $t_{pLH}$ is the transition time for a gate going from a logical low output state to a logical high output state and where $t_{pHL}$ is the transition time for a gate going from a high to a low output state.

For equal $t_{pLH}$ and $t_{pHL}$, then $$t_p = 3t_{pLH} + 3t_{pHL}.$$

When the gate input at terminal 19 is high, the output of the NOR gate 16 is forced low so that the output of inverter 14 gives low after a time delay of $2t_{pHL} + t_{pLH}$, that is, after the minimum time required for a rising output signal at the output of NOR gate 16 to propagate around the ring. The output signal at terminal 17 for the gated ring oscillator circuit 10 has a frequency $f_0$.

Figure 2A:
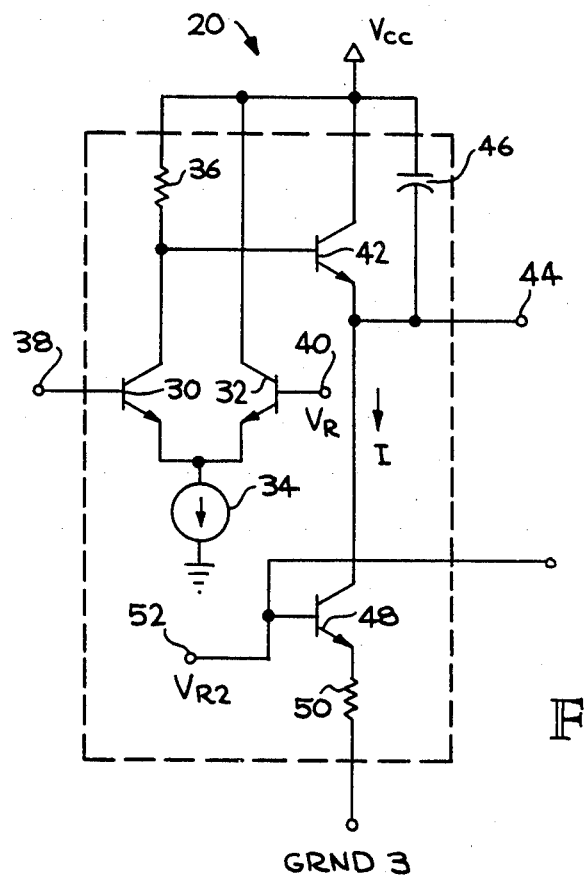
FIG. 2A is a schematic diagram of an ECL inverter stage according to the invention.
Figure 2B:
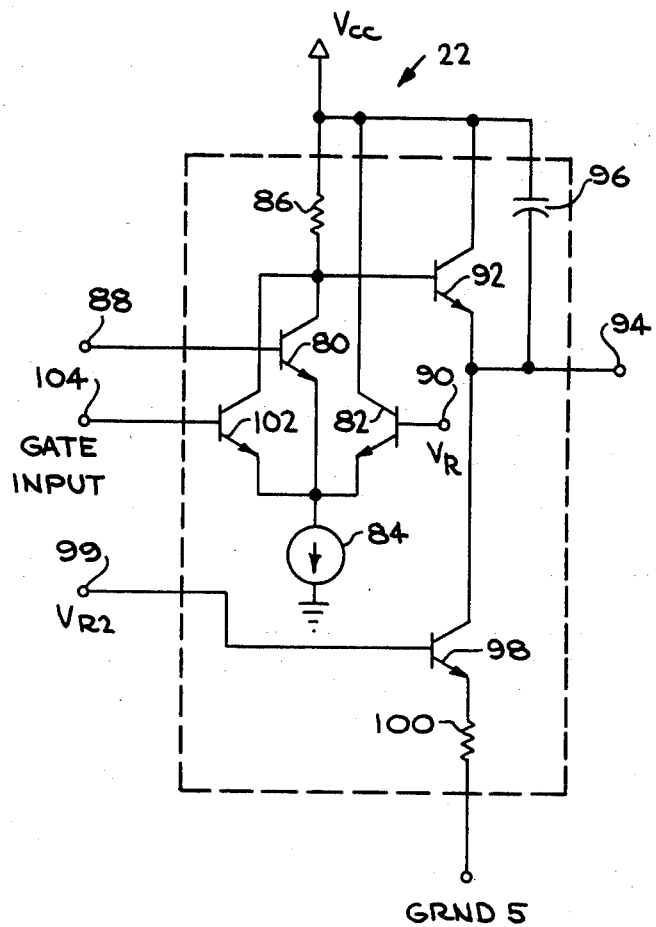
FIG. 2B is an ECL NOR gate stage according to the invention.
Figure 3:
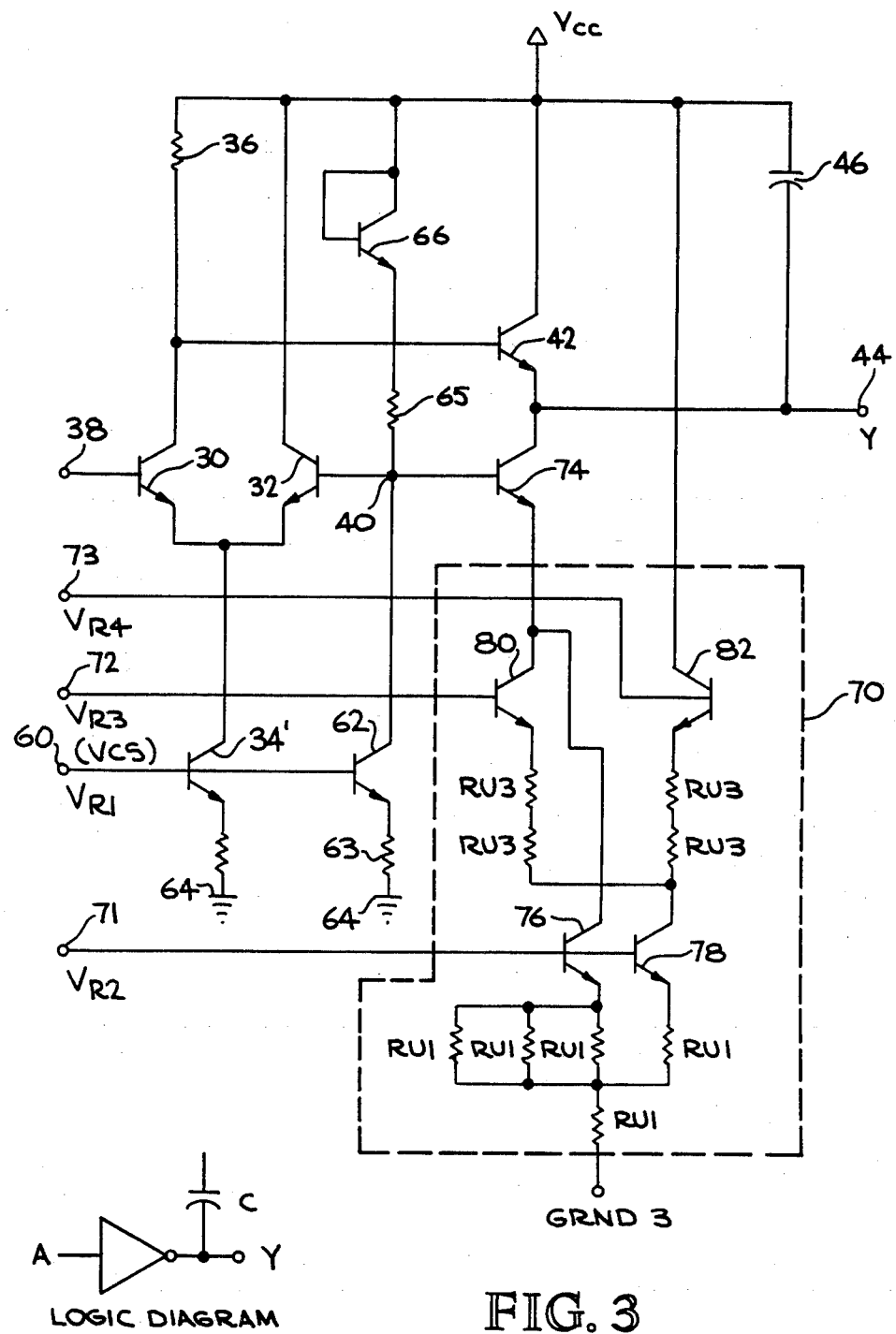
FIG. 3 is a schematic diagram of a more complex ECL inverter stage according to the invention.
Figure 4:
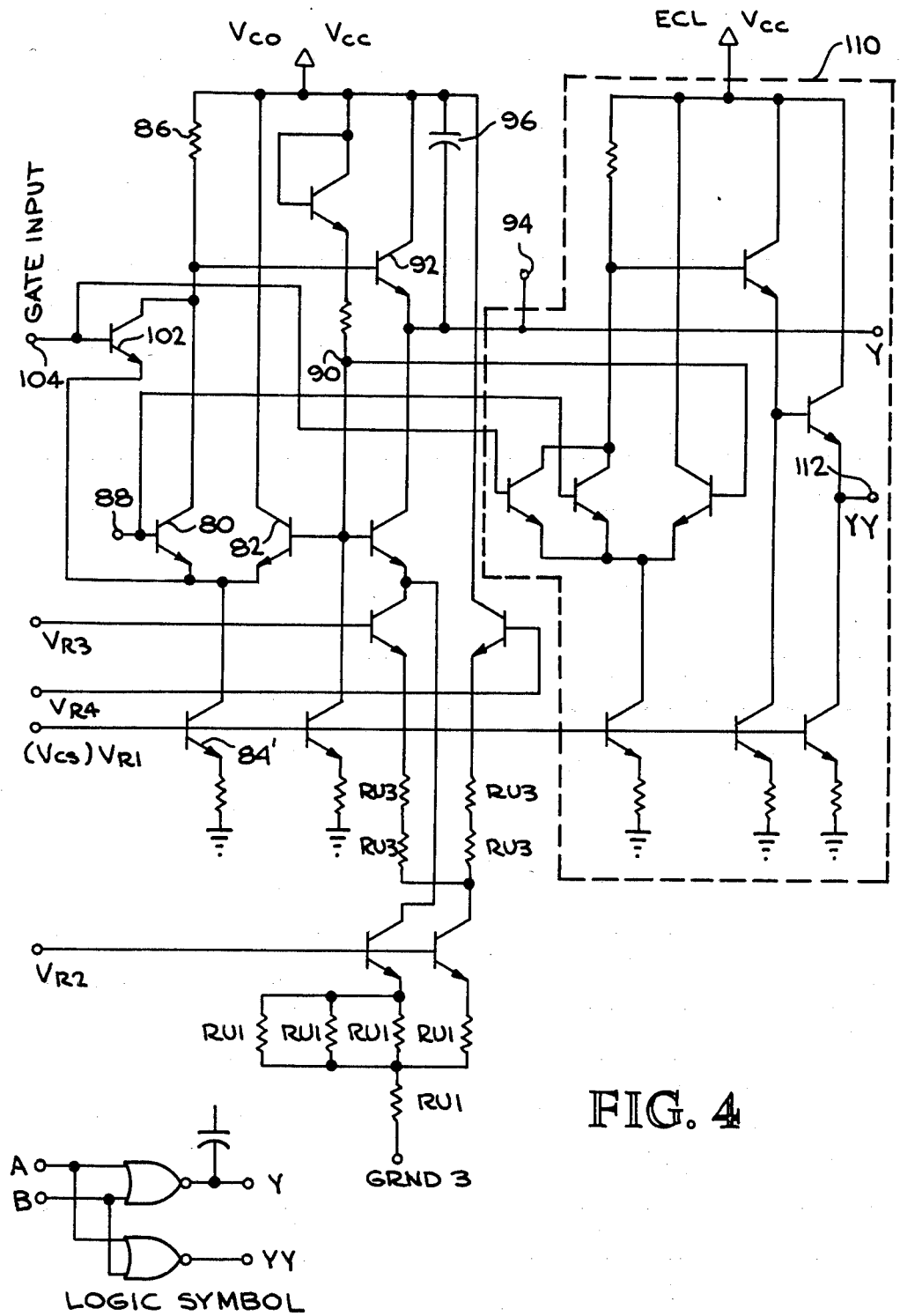
FIG. 4 is a schematic diagram of a gated voltage-controlled oscillator stage according to the invention.

FIG. 2A shows a circuit diagram for an emitter-coupled-logic ECL inverter stage 20 and FIG. 2B and emitter-coupled ECL NOR gate stage 22 such as used in the ring oscillator of FIG. 1. FIG. 3 shows a more complex ECL inverter stage while FIG. 4 shows a more complex NOR gate.

INVERTER STAGE

Referring to FIG. 2A, the inverter stage 20 is in emitter-coupled-logic ECL gate inverter stage circuit having a pair of emitter-coupled transistors 30, 32 having their emitter terminals tied together and supplied with current from a current source 34. Inverting transistor 30 has its collector terminal coupled to a positive voltage supply $V_{cc}$ through a resistor 36. Non-inverting transistor 32 has its collector terminal connected directly to the $V_{cc}$ voltage supply. The base terminal of the inverting transistor 30 is connected to an inverter stage input terminal 38, while the gate of the non-inverting transistor 32 is connected to a reference voltage, $V_R$, terminal 40. The collector of the transistor 30 is also connected to the base terminal of an output driver transistor 42, which has its collector terminal connected to the $V_{cc}$ voltage supply and which has its emitter terminal connected to an output terminal 44 of the inverter stage. A timing capacitor 46, having a capacitance value considerably larger than the circuit capacitances, is connected between the $V_{cc}$ voltage supply and the emitter terminal of the output driver transistor 42. The gate output terminal 44 is a circuit node from which current is removed through the collector terminal of a current-source transistor 48. The emitter terminal of transistor 48 is coupled to an internal ground GRND3 node through an emitter resistor 50. The base terminal 52 of the current-source transistor 48 is connected to a control input terminal 52 at which is supplied a reference voltage $V_{R2}$ for controlling the current drawn by the current source transistor 48 from the timing capacitor 46.

INVERTER STAGE OPERATION

Operation of the inverter stage of FIG. 2A is as follows:

A logic low level at input terminal 38 turns off transistor 30. The base of output driver transistor 42 is then turned on by current flow from the positive voltage supply $V_{cc}$ through resistor 36 into the base of transistor 42. Except for a small collector-to-emitter voltage drop across transistor 42, output terminal 44 is connected to the $V_{cc}$ voltage level. Transistors 30, 32, and 42 are typical of an ECL logic gate and cause output terminal 44 to be quickly connected to $V_{cc}$, typically in much less than a nanosecond. Thus, the so-called rise time for a signal on terminal 44 is very small.

A logic high at input terminal 38 turns on transistor 30, which causes transistor 42 to be turned off, leaving terminal 44 at a voltage near $V_{cc}$. The current-source transistor 48 is set by $V_{R2}$ and emitter-resistor 50 to draw a fixed current away from terminal 40 and thereby linearly draw the voltage at terminal 44 towards the lower potential of GRND3.

The current through transistor 48 is controlled by the control voltage $V_{R2}$ at terminal 52. Thus, it is seen that the so-called fall time of a signal on the output terminal 44 of the inverter 20 is controlled by the voltage $V_{R2}$ at terminal 52. Typically, the fall time is on the order of several nanoseconds or more, while the rise time is less than a nanosecond.

ANOTHER INVERTER STAGE

FIG. 3 shows a more complex inverter stage circuit 20, with elements common to FIG. 2A having the same reference numerals. A current source transistor 34' provides the same function as the current source 34 of FIG. 2A. Terminal 60 connected to the base terminal of the current source transistor 34' has a reference voltage $V_{R1}$ applied thereto to control the current to the emitter-coupled transistor pair 30, 32. $V_{R1}$ is a temperature-compensated voltage which is available, for example, on an integrated circuit. $V_{R1}$ also is a reference voltage for a voltage supply circuit which includes a current-source transistor 62 having its emitter coupled through an emitter resistor 63 to a local ground 64 (corresponding to VR in FIG. 2A), having its collector coupled to the reference voltage terminal 40, and then through another resistor 65 and a diode-connected transistor 66 to $V_{cc}$.

FIG. 3 includes a more complex current source circuit 70, shown in dotted lines, having control terminals 71, 72, and 73 for controlling the current, nominally 250 microamperes, provided through transistor 74 from output terminal 44. Terminal 71 has a voltage signal $V_{R2}$ applied thereto for controlling the currents through current-source transistors 76, 78 and as will be seen below, to phase-control one stage of a voltage-controlled oscillator. An increase in voltage $V_{R2}$ increases the current from terminal 44 and would increase the oscillator frequency. Terminal 72 has a voltage signal $V_{R3}$ applied thereto for controlling the current through a transistor 80 which sets the range of frequency adjustment for an oscillator or stage. Terminal 73 has a voltage signal $V_{R4}$ applied thereto which independently controls transistor 82 and the oscillator frequency. Increasing $V_{R4}$ decreases the frequency and is limited in range 0.75 $f_0$ max and $f_0$ max, where $f_0$ max is the maximum frequency obtained for a particular value of frequency control voltage $V_{R2}$. An oscillator with an output frequency which is a linear function of current is provided by forming a ring oscillator as in FIG. 1. Ignoring base currents and finite current gains and for capacitor 46 and other capacitances constant and for fixed voltage levels, the discharging current I is $I = I_{74}$ $I_{74} = I_{80} + I_{76}.$ For $V_{R3} = V_{R4}$;

$I_{80} = 1/2 I_{78}$ $I_{80} = (\frac{1}{2})(\frac{1}{2})(V_{R2} - V_{BE, 76, 78})/(5RU\frac{1}{4})$ $I_{80} = \frac{1}{2}(V_{R2} - V_{BE, 76, 78})/(5RU1);$ and $I_{76} = (\frac{1}{2})(V_{R2} - V_{BE, 76, 78})/(5RU\frac{1}{4})$ $I_{76} = 3(V_{R2} - V_{BE, 76, 78})/(5RU1).$ Therefore, $I = I_{74} = 7/2(V_{R2} - V_{BE, 76, 78})/(5RU1).$ Thus, the discharging current is almost a linear function of the control voltage.

NOR GATE STAGES

Referring to FIG. 2B, a NOR gate circuit 22 corresponding to the NOR gate 16 of FIG. 1 is shown. A pair of transistors 80, 82 have their emitter terminals tied together and are fed with current from a current source 84. Transistor 80 is an inverting input transistor which has its collector coupled to the supply voltage $V_{cc}$ through a resistor 86 while a non-inverting transistor 82 has its collector terminal connected directly to the supply voltage $V_{cc}$. The base of the inverting input transistor 80 is connected to an input terminal 88 which can be connected, for example, to the output terminal 44 of the inverter stage 20 as shown in FIG. 2A. The base of the non-inverting input transistor 82 is connected to a reference voltage terminal 90 which is supplied a voltage reference $V_r$. An output driver transistor 92 has its base connected to the collector of the inverting input transistor 80. An output terminal 94 has a timing capacitor 96 connected from thence to the $V_{cc}$ voltage supply. The output terminal 94 has current removed therefrom through a collector terminal of a current source 98, which has its emitter coupled through a resistor 100 to the GRND3 terminal. The base of the transistor 98 is connected to terminal 99 which has the voltage reference $V_{R2}$ connected thereto. A second inverting input transistor 102 is connected in parallel to the transistor 80 as shown. The base terminal of the second inverting transistor 102 is connected to a gate input terminal 104 at which is provided a signal for disabling the NOR gate 22.

FIG. 4 shows in more detail the circuit diagram for the NOR gate circuit 22 of FIG. 2B with the same numerals being used for components common to both circuits. The left hand side of FIG. 4 is very similar to the circuit of FIG. 3 with the addition of the second inverting input transistor 102. FIG. 4 also shows a parallel inverter gate circuit 110 without a charging capacitor and having a positive supply voltage ECL VCC and an output signal YY for interfacing with other logic circuits.

VCO

Figure 5A:
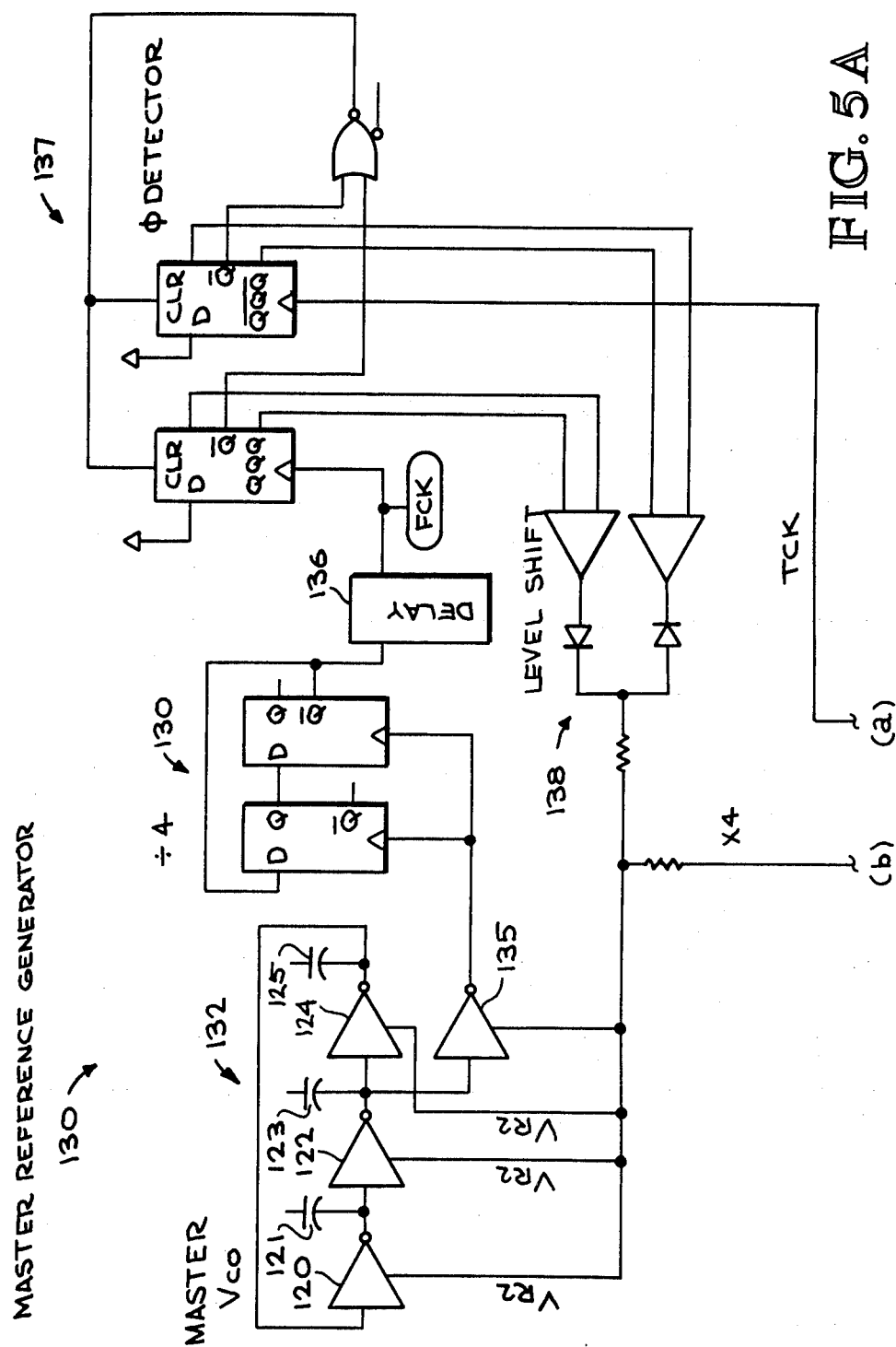
FIG. 5A is a block diagram showing a first phase-locked loop circuit receiving a system-reference signal and using a voltage-controlled oscillator according to the invention.

Referring to FIG. 5A three inverter stages 120, 122, 124 as described above are shown with timing capacitors 121, 123, 125 in a ring oscillator configuration. With reference to FIGS. 2A and 3, the inverter turn on time $t_{pLH}$, or rise time, is only slightly affected by the timing capacitor. The turnoff time $t_{pLH}$, or fall time, is an inverse linear function of the charging current I into terminal 44. The gate delays and, consequently, the period of a ring oscillator using such inverter stages is determined by (1) the voltage swing from a large high level to the voltage $V_R$ at terminal 40, (2) the magnitude of the discharging current, and (3) the value of the capacitor 46. With capacitor 46 fixed, and the voltage swing fixed, the frequency of an oscillator is a linear function of the charging current I into terminal 44.

The configuration of FIGS. 5A and 5B is provided in integrated circuit form to provide, among other things, a voltage-controlled ring oscillator.

In the Advanced Micro Devices, Inc., AM7991 Serial Interface Adapter, used for Manchester-encoders, the ring oscillator operates at 40 MHz and is divided by four to provide clock signals at one-quarter bit intervals. The controlled fall times are 7.6 nanoseconds, the voltage differences are 0.5 volts, and the total fixed and parasitic charging capacitances are 3.8 picofarads.

PHASE-LOCKED LOOP

Portions of a phase-locked digital data receiver of the AM7991 circuit are shown. A first voltage-controlled oscillator VCO and a second reference VCO provide frequency limits and phase control for a reference frequency signal. This communication receiver has been designed to utilize matched integrated circuit components and is designed to meet the timing and acquisition requirements set forth in various standards. In addition, the recovered reference frequency must not exceed the transmit frequency by 15% under any conditions.

FIGS. 5A and 5B are the block diagrams for a clock reference generator for decoding Manchester-encoded data signals. The Master Reference Generator (MRG) circuit 130 of FIG. 5A is an analog phase-locked loop which produces control voltage X4. The MRG 130 includes a VCO 132 having inverters 120, 122, 124, which a feeds a divide-by-four circuit 134.

A VCO output buffer stage 135 similar to the parallel inverter circuit 110 of FIG. 4 is provided. The edge-triggered D flip-flop divide-by-four circuit 134 divides the output signal which is then delayed through a delay circuit 136 to provide a VCO signal FCK to one input of a phase-reference circuit 137. A second input signal TCK to the phase-reference circuit 137 is the transmit reference frequency clock which is provided from a crystal-oscillator source (not shown) for the system. The phrase-reference circuit uses two D flip-flops as a pulse-position phase-detector and the D flip-flop output signals are inputted to a phrase-correction, level-shaping circuit 138. The output of circuit 138 is signal X4 which is the VCO voltage control signal corresponding to $V_{R2}$ of FIGS. 2A, 2B, 3 and 4.

The VR3 and VR4 inputs corresponding to inverter stages 120, 122, 124 are connected together and to an internal bias voltage which is set at one-half the integrated circuit supply voltage $V_{cc}$. Considering the TCK signal as an input and X4 (or $V_{R2}$) as an output, this loop is, then, a frequency-to-voltage converter. It will be seen that X4 is also used as one of two control voltages for a decoder VCO (DVCO) 140 portion of the clock reference recovery phase-locked loop 142 of FIG. 5B.

Referring to FIG. 5B, the DVCO 140 is similar to the MRG VCO 132 of FIG. 5A. The VR2 terminals for the DVCO are connected to X4 from FIG. 5A. VR3 of the DVCO is connected to a separate bias voltage (to minimize cross talk between the two oscillators) set at one-half $V_{cc}$. VR4 for the DVCO is the phase control voltage.

Input logic signals to the DVCO phase-locked loop 142 include a valid received signal detect signal VCOG and a received line active signal PL2. The transmit clock reference signal, TCK, is crystal-controlled and functions as a system reference signal. The recovered Manchester clock signal MNCK is also provided to the DVCO loop 142.

The clock reference recovery loop 142 includes the decoder VCO 140, controlled in frequency range by VR2 from the VCO 132 of the MRG circuit 130 of FIG. 5A. The VCO 140 includes three ECL inverter stages 144, 146, 148, a parallel output inverter 151, and corresponding charging capacitors 145, 147, 149. The output of the VCO circuit 140 is provided from a terminal 150 to a divide-by-four circuit 152 and then as receiver clock RCK to one input of a pulse-position phase circuit 154 which provides an appropriately delayed two-times receiver. The other input to the phase-detector circuit 154 is either the system reference signed transmit clock TCK or the received Manchester clock signal MNCK, as gated by signal PL2 through selection gates 153A and 153B. The output of the phase-detector 154 is level-shifted through level shift circuit 156, which provides a phase-control voltage signal VR4 for the decoder VCO 140. The decoder VCO 140 also receives a frequency-control voltage signal as VR2 from the VCO loop of the MRG circuit 130, which bounds the frequency of the DVCO loop within limits for easy lock-on to a received signal.

Operation of the system is as follows for matched integrated-circuit VCO circuits:

When the received data channel is idle, PL2 is low so that DVCO is locked to TCK. When a signal is detected on the data line, VCOG goes to a logic high level which sets the outputs of inverter stages 148, 151 low, clears the counter of divider 152 and clears the phase detector 154 stages at the negative clock transistion of a Manchester data cell. This clock transition also produces a signal VCOG which enables the incoming clock at the following negative input transition. At the next negative input transition, VCOG goes low restarting DVCO 140, which is then synchronized to this negative input transition and PL2 is enabled to accept clock signals from the incoming data. After a delay to hold the preset count in the stages of the divider 152, the clear input signal thereto is removed from the divider 152 and phase detector 154. DVCO 140 cycles through its first period and the second rising edge at terminal 150 of the parallel stage 151 clocks the divider 152 to produce RCK. The 5th rising edge at terminal 150 is compared to the incoming clock MNCK. A phase-error correction signal for the loop 142 is provided as X3 or $V_{R4}$ of the DVCO 140.

DVCO, then, is locked on the incoming clock MNCK and tracks MNCK from the VCOG high-to-low transition. When the incoming signal stops, PL2 is removed and the DVCO loop 142 resumes tracking TCK.

When connected in a phase-locked loop, the control voltage changes, as needed, to maintain the VCO frequency. Each inverter stage of a VCO provides a precisely controlled fall time.

PRECISE PULSE DELAYS

Figure 6:
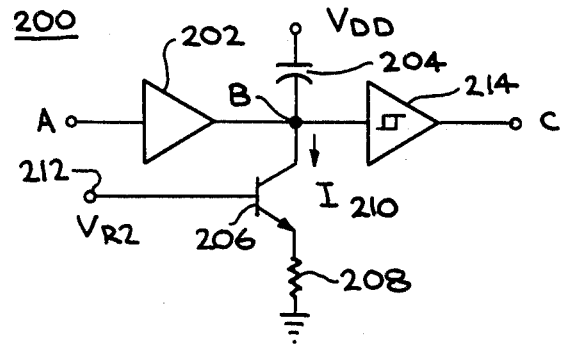
FIG. 6 is a logic diagram of a delay generator according to the invention.

FIG. 6 shows a time-delay circuit 200 which is used to generate precise time-delays for pulse signals appearing at an input terminal A thereof. Recall that the control voltage X4 in the phase-locked loop of FIG. 5A is very nearly directly proportional to the frequency of the reference signal, that is, as the frequency of the reference signal changes, the control voltage X4 changes. This relationship is used to provide fairly precise delays with accuracies to a predetermined delay of a few percent. To a good approximation, the control voltage is proportional to the fall time of a VCO gate stage.

FIG. 6 shows a noninverting ECL stage 202 which has an output terminal B with a delay-timing capacitor 204 coupled between it and a positive supply voltage $V_{DD}$. A delay-current-source transistor 206, has its collector coupled between terminal B and through a resistor 208 to a ground potential. Current $I_{210}$ is controlled by a control voltage such as $V_{R2}$ at its base terminal 212. As described previously, the fall time of a signal at terminal B is controlled by current $I_{210}$, which is controlled by $V_{R2}$ at terminal 212. If $V_{R2}$ at the control voltage of a phase-locked loop, such as shown in FIG. 5A, the fall time of a signal at terminal B is proportional to the frequency of the reference signal into the phase-locked loop.

Figure 7:
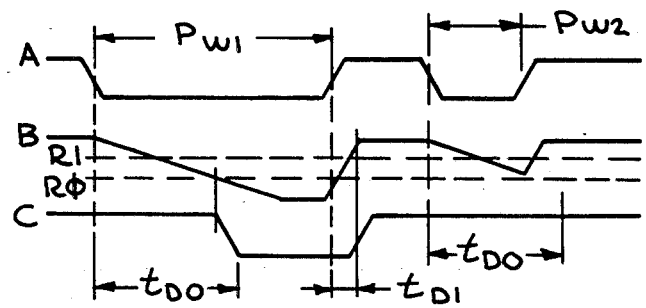
FIG. 7 shows voltage waveforms as a function of time at several points in the logic diagram of FIG. 6.

A hysteresis circuit 214 has its input connected to terminal B and an output signal is provided at terminal C. Voltage waveforms at terminal A, B, and C of FIG. 6 are shown in FIG. 7. A time-delay $t_D$ is found to be inversely proportional to the magnitude of $I_{210}$. FIG. 7 shows two input pulses at terminal A, the first having a pulse-width time PW1 and the second having a pulse-width PW2. The hysteresis circuit 214 has an upper threshold voltage R1 and a lower threshold voltage R0 with the hysteresis voltage being the difference therebetween. The first pulse triggers the leading edge of an output pulse at terminal C after a delay of $t_{D0}$. After the pulse-width time PW1 expires, the output pulse trailing edges occurs after a small delay $t_{D1}$, that is, after the signal at terminal B exceeds the upper threshold R1.

The second input pulse with a pulse-width PW2 has a duration too short for the signal at terminal B to fall below R0 and trigger the hysteresis circuit 214. Consequently, no output pulse at C is produced. The circuit of FIG. 6 can thus be used as a pulse-width discriminator, with input pulses at terminal A having a width, or time-duration, of less than a prescribed value not triggering a delayed output pulse at terminal C. Similarly, this circuit can be used to detect that a valid signal is present with a frequency below some predetermined maximum frequency or its complement by cascading two circuits as in FIG. 6 to detect pulses within a certain range. When the frequency of a desired signal is known, delay circuits of this type are useful in rejecting out-of-band noise and for detecting the presence of a desired carrier signal.

Figure 8:
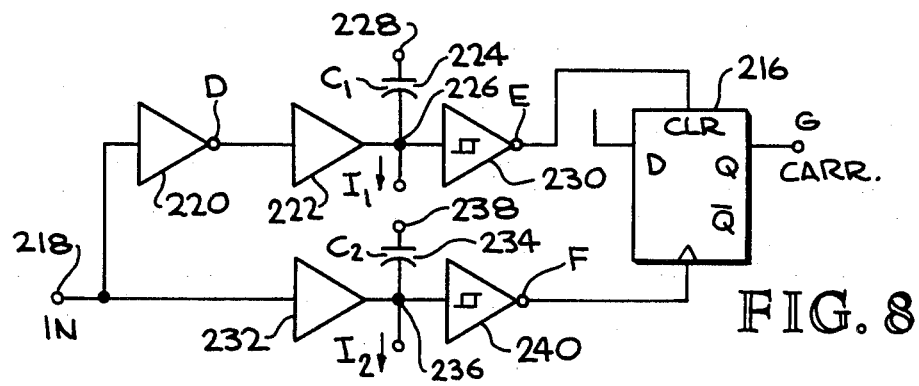
FIG. 8 is a block diagram for a Manchester-signal detector according to the invention.

FIG. 8 shows such a combination used in conjunction with an edge-triggered D flip-flop 216. An input signal IN appears at an input terminal 218 of an ECL inverter stage 220 which has its output terminal coupled to the input terminal of a noninverting ECL stage 222 having an output terminal 226 fed by an appropriate current $I_1$, from a current-source similar to that controlled by $V_{R2}$ of FIG. 6. C1, capacitor 224, is connected between the output terminal 226 and a positive voltage reference terminal 228. The input of a hysteresis circuit 230 is connected to terminal 226 and the output terminal E of the hysteresis circuit 230 is connected to the clear input CLR of the edge-triggered D flip-flop 216.

Figure 9:
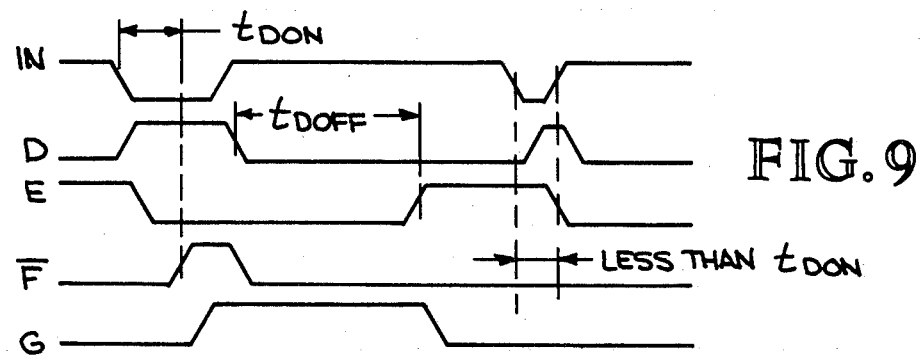
FIG. 9 shows waveform diagrams for the block diagram of FIG. 8.

Input terminal 218 is also connected to the input terminal of another ECL noninverting ECL stage 232 having an output terminal 236 fed by another current $I_2$ from a current source. C2, capacitor 234, is connected between the output terminal 236 and a positive voltage reference terminal 238. The input of another hysteresis circuit 240 is connected to terminal 236 and the output terminal F of the hysteresis circuit 240 is connected to the clock input of the D flip-flop 216, which has a Q output terminal G at which appears a signal CARR for an input pulse signal having sufficient on-time. FIG. 9 shows waveforms at various terminals for the circuit of FIG. 8.

Figure 10:
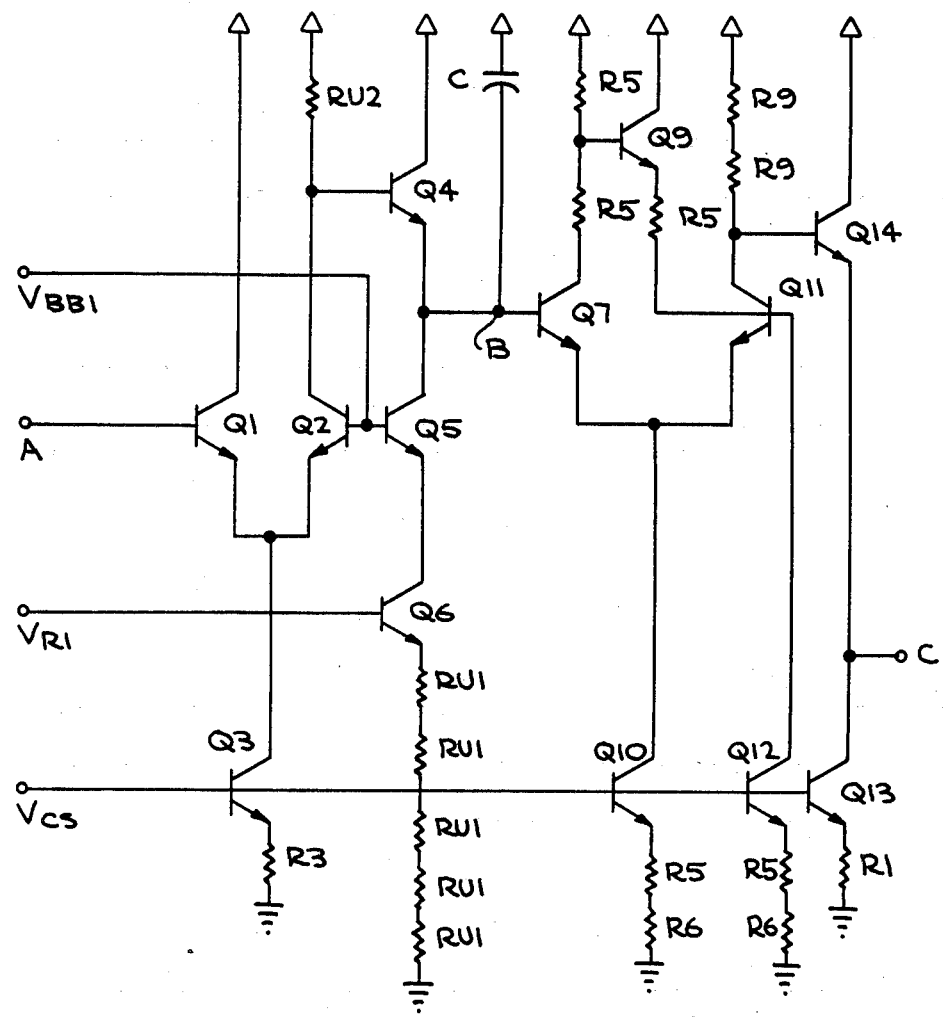
FIG. 10 is a schematic diagram of a non-inverting delay circuit according to the invention.
Figure 10:
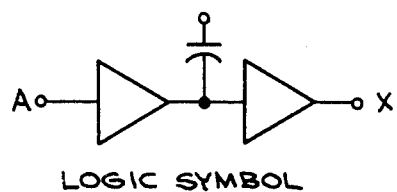
Figure 11:
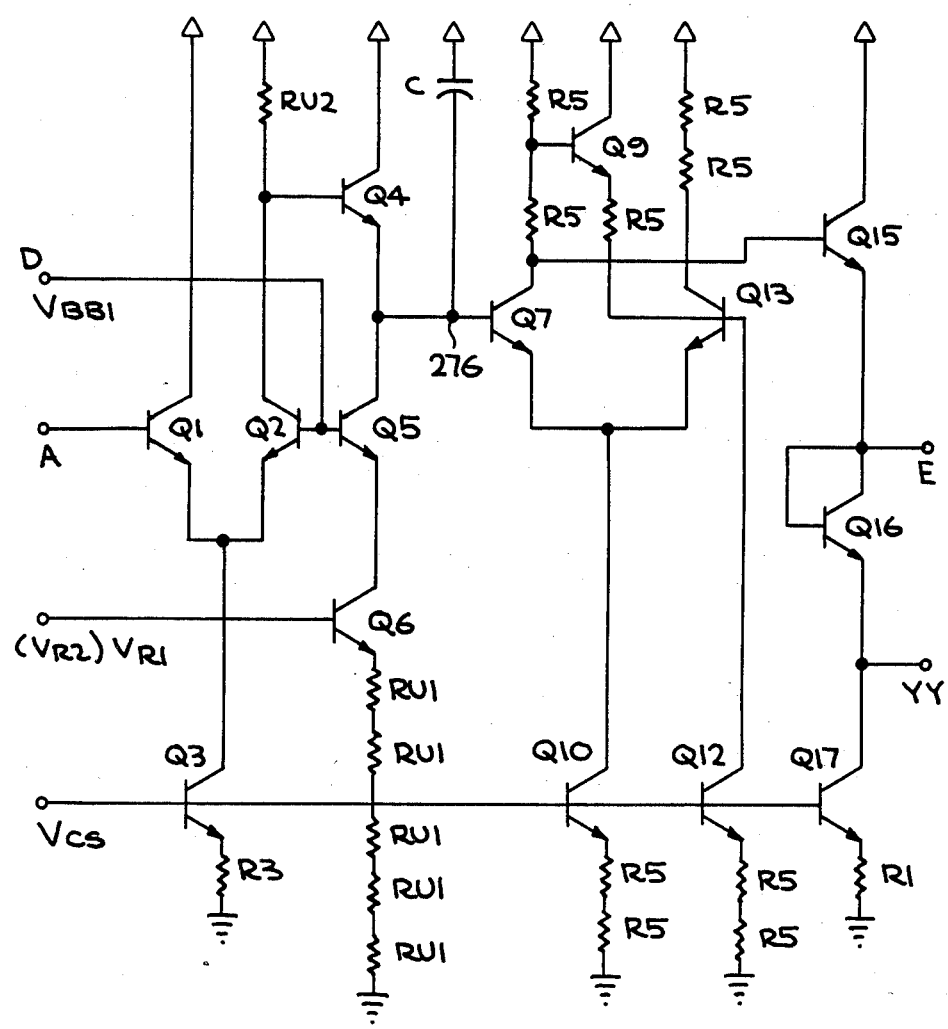
FIG. 11 is a schematic diagram of an inverting delay generator according to the invention.
Figure 11:
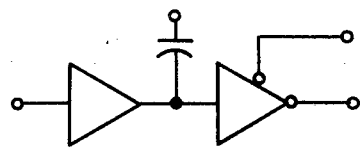

FIGS. 10 and 11 are circuit diagrams, respectively, for a noninverting and an inverting time delay circuit. The noninverting circuit of FIG. 10 corresponds to the block diagram of FIG. 6. The inverting circuit of FIG. 11 corresponds to the delay circuits of FIG. 8. Similar reference numerals are used in each circuit for similar components. Q1, Q2, Q4, Q5, Q6, and C form an ECL stage similar to those shown in FIG. 2A. Q7, Q9, and Q11 form a hysteresis circuit.

Operation of the circuit of FIG. 10 is as follows:

Q1 is initially on, Q2 off and the emitter of Q4 high. When input A transitions low Q2 turns on and turns Q4 off. The base of Q7 then charges toward ground at a rate determined by the current through Q5 and C. When the base of Q7 and the base of Q11 approach 0 volts difference, current flow is shifted from Q7 to Q11. Transistor Q9 provides a reference voltage for the base of Q11, and, as conduction starts in transistor Q11, its threshold is lowered to provide a positive feedback signal to the differential input Q7, Q11. At the onset of current flow in Q11 the feedback signal shifts the threshold of this gate so that the output at the emitter of Q14 switches high to low. The input terminal at A accepts normal logic-voltage swings and the output at the emitter of Q14 provides normal logic-voltage swings. The internal signal at the base of Q4 is 3/2 logic swing. The logic 0 threshold at the base of Q7 is 1 logic swing and the logic 1 threshold is ½ logic swing. The hysteresis voltage is ½ logic swing and internal noise margins are ½ logic swing for any conditions at input terminal A.

The circuit of FIG. 11 functions the same as that of FIG. 10 except that the output is taken from the collector of Q7 through Q15. This produces a delayed rising output. Diode-conected transistor Q16 provides a level shift to drive lower level ECL inputs.

Delays using these circuits have been fabricated for 20, 35, 112, and 175 nanoseconds. These delay generators have been measured to track design value within ±,2% over the temperature and supply environment of an IC chip.

In summary, the invention provides the following features:

The fall time of an ECL gate stage is controlled by the value of a charging capacitor, a controlled pull-down current, and the voltage over which the capacitor charges. A voltage-controlled ring oscillator comprised of ECL gate stages having controlled fall times can be constructed with a wide frequency range. Such an oscillator can be interrupted, or operated in a start-and-stop mode, without affecting the oscillator period. A phase-locked loop constructed of such ECL gate stages serves as a frequency-to-voltage convertor. Two such phase-locked loops are utilized such that the second VCO is independently controlled in phase, but the second VCO is bounded in its frequency range by the first VCO. A Manchester-data decoder using matched VCO circuits has a wide tolerance to noise and provides a clock reference signal for decoding data signals from noisy received signals. Carrier activity on a Manchester-data line is detected using circuits described above. Using precision delay circuits permits descrimination between noise signals and valid signals. Precise pulse delays are obtained which are proportional to the frequency of a reference signal. A Manchester-decoder clock is quickly synchronized in phase by interrupting and starting a VCO. The frequency of a reference clock signal is multiplied. Wide variation of integrated-circuit parameters are tolerated.

The foregoing description of preferred embodiments of the invention have been presented for purposes of illustration and description. It is not intended to be exhaustive or to limit the invention to the precise forms disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto and their equivalents.

I claim:

1. A voltage-controlled oscillator (VCO) circuit, comprising:
    one or more emitter-coupled-logic (ECL) inverter stages connected as a ring oscillator, each ECL inverter stage having a respective first input terminal and a respective output terminal, each ECL inverter stage having a timing capacitor coupled between its output terminal and a first supply voltage, each ECL inverter stage having a first current source coupled between its output terminal and a second supply voltage, each first current source having a control terminal for varying its output current such that its output current controls the fall time of an output signal on the output terminal of the respective ECL inverter stage and such that the frequency of the ring oscillator is variable in response to a control signal applied to the control terminal of each first current source.

2. The circuit of claim 1 wherein at least one of the one or more ECL inverter stages includes:
    a first inverting-input transistor having a collector terminal coupled through a first resistance element to the first supply voltage, an emitter terminal coupled through a second current source to the second supply voltage, and a base terminal coupled to an inverting-input terminal of the ECL inverter stage; and
    a second inverting-input transistor having a collector terminal connected to the collector terminal of the first inverting-input transistor, and a base terminal coupled to a second inverting-input terminal of the ECL inverter stage such that the voltage-controlled oscillator circuit is interrupted in operation when the second inverting-input transistor is turned on.

3. The circuit of claim 1 wherein the one or more ECL inverter stages connected as a ring oscillator comprises three ECL inverter stages.

4. The circuit of claim 1 wherein a single control signal is commonly applied to the respective control terminals of each of the one or more ECL inverter stages.

5. The circuit of claim 1 wherein each of the one or more ECL inverter stages includes:
    an output driver transistor having an emitter terminal coupled to the ECL inverter stage output terminal, a collector terminal coupled to the first supply voltage, and a base terminal coupled through a first resistance element to the first supply voltage, which output driver transistor, when turned on, discharges the timing capacitor and controls the rise time of an output signal on the output terminal of the ECL inverter stage, said rise time being substantially less than said fall time of each ECL inverter stage.

6. The system of claim 1 wherein the VCO circuit includes means for dividing the ring oscillator frequency by an integer n and providing a signal with a frequency divided by n.

7. A phase-locked loop system, receiving a system reference signal, comprising:
    a voltage-controlled oscillator (VCO) circuit having an output terminal at which is supplied a VCO-output signal and having one or more emitter-coupled-logic (ECL) inverter stages connected as a ring oscillator, each ECL inverter stage having a respective first input terminal and a respective output terminal, each ECL inverter stage having a timing capacitor coupled between its output terminal and a first supply voltage, each ECL inverter stage having a first current source coupled between its output terminal and a second supply voltage, each first current source having a control terminal for varying its output current such that its output current controls the fall time of an output signal on the output terminal of the respective ECL inverter stage and such that the frequency of the ring oscillator is variable in response to control signals applied to the control terminals of the respective first current sources for the one or more ECL inverter stages; and phase-detector means having a first input terminal coupled to the output terminal of the VCO circuit for receiving the VCO-output signal, said phase-detector means having a second input terminal for receiving the system reference signal, said phase-detector means having an output terminal coupled to the control terminals of the respective first current sources of the one or more ECL inverter stages of the VCO circuit, said phase-detector means for providing a VCO-control signal proportional to the difference in phase between the system reference signal and the VCO-output signal at the output terminal of the phase-detector means.

8. The system of claim 7 wherein the VCO circuit includes means for dividing the ring oscillator frequency by an integer n and providing a signal with a frequency divided by n to the output terminal of the VCO circuit so that the frequency of the VCO circuit is n times the frequency of the system referencing signal.

9. A circuit for delaying an input pulse in response to a control signal comprising:
a first emitter-coupled-logic (ECL) noninverting stage having an output terminal and having an input terminal for receiving the input pulse;
a first delay-timing capacitor coupled between the output terminal of the first ECL noninverting stage and a first supply voltage;
a first delay-current source coupled between the first ECL noninverting stage output terminal and a second supply voltage, said first delay-current source having a control terminal for varying its output current and the control terminal coupled to receive the control signal, with the fall time of a signal on the output terminal of the first ECL noninverting stage being proportional to the control signal.

10. The circuit of claim 9, including:
a first hysteresis circuit having an output terminal and having an input terminal coupled to the output terminal of the first ECL noninverting stage said first hysteresis circuit providing at its output terminal a pulse having a width proportional to the control signal.

11. The system for discriminating an input pulse width comprising:
an inverter coupled to receive the input pulse and to generate an inverted input pulse at its output;
a first ECL noninverting stage having an output terminal and having an input terminal coupled to the output of the inverter for receiving the inverted input pulse;
a first delay-timing capacitor coupled between the output terminal of the first ECL noninverting stage and a first supply voltage;
a first delay-current source coupled between the first ECL noninverting stage and a second supply voltage, said first delay-current source having a control terminal for varying its output current and the control terminal coupled to receive the control signal, with fall time of the signal on the output terminal of the first ECL noninverting stage being proportional to the control signal;
a second ECL noninverting stage having an output terminal and having an input terminal for receiving the input pulse;
a second delay-timing capacitor coupled between the second ECL noninverting stage output terminal and the first supply voltage;
a second-delay-current source coupled between the second ECL noninverting stage and the second supply voltage said second delay-current source having a control terminal for varying its output current coupled the control signal with the fall time of a signal on the output terminal of the second ECL noninverting stage being proportional to the control signal;
a second hysteresis circuit having an output terminal and having an input terminal coupled to the output terminal of the second ECL noninverting stage, said second hysteresis circuit providing at its output terminal a pulse having a variable width proportional to the control signal;
wherein the first delay-timing capacitor has a larger capacitance value than the second delay-timing capacitor.

12. The system of claim 11 including:
an edge-triggered flip-flop circuit having a clock input terminal coupled to the output terminal of the second hysteresis circuit, said edge-triggered flip-flop having a clear terminal coupled to the output of the first hysteresis circuit, said flip-flop circuit having an output terminal which is activated in response to an input pulse having a pulse width greater than a predetermined time.

13. The system of claim 12 wherein the input pulse is a Manchester-encoded data signal.

14. An ECL gate having an output terminal and an inverting-input terminal and having a controlled fall time, including:
a timing capacitor coupled between a first voltage source and the output terminal;
a first current source coupled between the output terminal and a second voltage source, said first current source having a control input terminal for controlling the current provided by said first current source;
an output driver transistor having an emitter terminal coupled to the output terminal, a collector terminal coupled to the first voltage source, and a base terminal coupled through a first resistance element to the first voltage source;
an inverting-input transistor having a collector coupled to the base terminal of the output driver transistor, an emitter coupled through a second current source to the second voltage source, and a base terminal coupled to the inverting-input terminal; and
said first current source having its output current controlled by a signal on its control input terminal to control the current charging the timing capacitor and thereby control the fall time of the output signal on the output terminal.

15. The ECL gate of claim 14 including a second inverting-input transistor having a collector coupled to the first voltage source, an emitter coupled to the coupled emitters of the ECL gate, said second inverting-input transistor being used to disable the ECL gate.

16. A system for producing a receiver clock reference signal from a received signal and receiving a system reference signal, comprising:
 a first voltage-controlled oscillator (VCO) having an output terminal and a first VCO frequency-control terminal, and providing a first VCO output signal at its output terminal, the frequency of the first VCO output signal being proportional to a first VCO control voltage applied at the first VCO frequency-control terminal;
 wherein
  the first VCO includes at least one emitter-coupled-logic (ECL) inverter stage, each ECL inverter stage having an input terminal and an output terminal, a timing capacitor coupled between its output terminal and a first supply voltage, and a controllable current source coupled to supply current at its output terminal, the controllable current source being coupled to the first VCO frequency-control terminal and including a means responsive to the first VCO control voltage for controlling its output current;
 a first phase detector having a first input terminal coupled to the output terminal of the first VCO for receiving the first VCO output signal and having a second input terminal for receiving the system reference signal, said first phase detector having an output terminal coupled to the first VCO frequency-control terminal and providing the first VCO control voltage at its output terminal for locking the frequency of the first VCO output signal to the frequency of the system reference signal;
 a second VCO, having an output terminal, a second VCO frequency-control terminal coupled to the first VCO control voltage and a phase-control terminal, and providing the receiver clock reference signal at its output terminal; and
 a second phase-detector having a first input terminal coupled to the output terminal of the second VCO, having a second input terminal coupled to receive the received signal, and having an output terminal coupled to the phase-control terminal of the second VCO, said second phase detector for providing a second VCO control voltage at its output terminal for locking the phase of the receiver clock reference signal to the phase of the received signal, whereby the frequency of the receiver clock reference signal is bounded in its frequency range by the first VCO control voltage and the phase of the receiver clock reference signal is independently controlled by the second VCO control voltage.

17. A system of claim 16 wherein, the second VCO includes at least one ECL inverter stage, each ECL inverter stage including an input terminal and an output terminal, a timing capacitor coupled between its output terminal and the first supply voltage and a controllable current source coupled to supply current at its output terminal, the controllable current source being coupled to the second VCO frequency-control terminal and to the phase control terminal and including means for varying its output current in response to the first VCO control voltage and second VCO control voltage applied to said second frequency-control terminal and the phase control terminal, respectively.

18. The system of claim 17, wherein the second VCO includes means for disabling the at least one ECL inverter stage to interrupt the operation of the second VCO.

19. The system of claim 17, wherein the first and second VCOs are formed as substantially similar circuits on an integrated circuit device.

20. The system of claim 16, wherein the received signal is a Manchester-encoded data signal.

21. The system of claim 16, further including means for providing the received signal, including:
 switching means having a first input coupled to the received signal, a second input coupled to the system reference signal, for providing the received signal when it is available and for providing the system reference signal when no received signal is available, so that the frequency of the receiver clock reference signal provided by the second VCO is maintained near the frequency of the system reference signal when no received signal is available.

22. The system of claim 21, including means for disabling operation of the second VCO, and means for synchronizing the phase of the receiver clock reference signal provided by the second VCO with a control pulse.

* * * * *